United States Patent [19]
Ishimitsu et al.

[11] Patent Number: 5,255,325
[45] Date of Patent: Oct. 19, 1993

[54] SIGNAL PROCESSING CIRCUIT IN AN AUDIO DEVICE

[75] Inventors: Shunsuke Ishimitsu; Hisashi Kihara; Shuichi Mori, all of Saitama, Japan

[73] Assignee: Pioneer Electronic Corporation, Tokyo, Japan

[21] Appl. No.: 913,620

[22] Filed: Jul. 16, 1992

[30] Foreign Application Priority Data

Oct. 9, 1991 [JP] Japan .................. 3-262071

[51] Int. Cl.$^5$ .............................................. H03G 3/00
[52] U.S. Cl. ...................... 381/107; 381/106; 333/14
[58] Field of Search ............. 381/104, 107, 108, 22, 381/68.2, 68.4, 106; 333/14

[56] References Cited
U.S. PATENT DOCUMENTS
4,628,529 12/1986 Borth et al. ................ 381/68.2

*Primary Examiner*—Forester W. Isen
*Attorney, Agent, or Firm*—Finnegan, Henderson, Farabow, Garrett & Dunner

[57] ABSTRACT

A signal processing circuit in an audio device includes a variable gain control section for providing a variable amplification gain to an input signal in response to a gain control signal, an input signal level detecting section for detecting a level of the input signal and for generating a corresponding detection signal, and a time constant setting section for storing a plurality of time constant tables. Each one of the plurality of time constant tables includes a set of input signal delay characteristics corresponding to a predetermined level of the input signal. A time constant selecting section selects one of the plurality of time constant tables in the time constant setting section in response to the detection signal. The gain control signal is determined by the selected one of the plurality of time constant tables and the amplification gain of the variable gain control section is varied according to the selected one of the plurality of time constant tables.

6 Claims, 6 Drawing Sheets

SIGNAL PROCESSING CIRCUIT IN AN AUDIO DEVICE

BACKGROUND OF THE INVENTION

1. Field of the Invention

This invention relates to a signal processing circuit, such as a compressor, limiter or expander, and particularly relates to a signal processing circuit in an audio device which subjects an input signal to variable amplification in accordance with the level of the input signal.

2. Discussion of the Related Art

Electronic audio devices, such as compact-disc (CD) players, digital audio tape (DAT) recorder/reproducers, cassette tape players, and radio tuners, are used to reproduce audio signals from various recording media, or from broadcast radio signals. The quality of the reproduced audio signals heard by a listener, that is the incident auditory characteristics of the audio signals, is generally determined by the content of the reproduced audio signal, and the nature of the audio reproducing environment. The content of the reproduced audio signal can be as varied as the audio components of a single voice as compared with a classical orchestra. Likewise the reproducing environment may vary in size, acoustic quality, and level of ambient background noise.

For example, in a case where a musical audio signal is reproduced in an environment having a high level of background noise, such as a motor car or train, pianissimo portions of the audio signal cannot be heard over the noise. This difficulty may be overcome by increasing the volume, i.e., increasing the gain of the audio signal amplifying circuits, but this method is often not practical because any loud portions of the audio signal are reproduced too loudly. Other environments exist where generally increasing the volume of the audio signal is unacceptable. For example, musical audio signals may be objectionable to persons other than the listener in quiet environments such as public buildings, trains or elevators. In such instances, audio signals must be reproduced at modest or low volumes, and the pianissimo portions of the audio signals may become difficult to hear.

Conventional audio devices have applied a variety of signal processing circuits in various attempts to eliminate the above-described difficulties. These signal processing circuits include a compressor for compressing the dynamic range of an output signal, a limiter for limiting the maximum level of the output signal, and an expander for expanding the dynamic range of the output signal.

Figure 7:
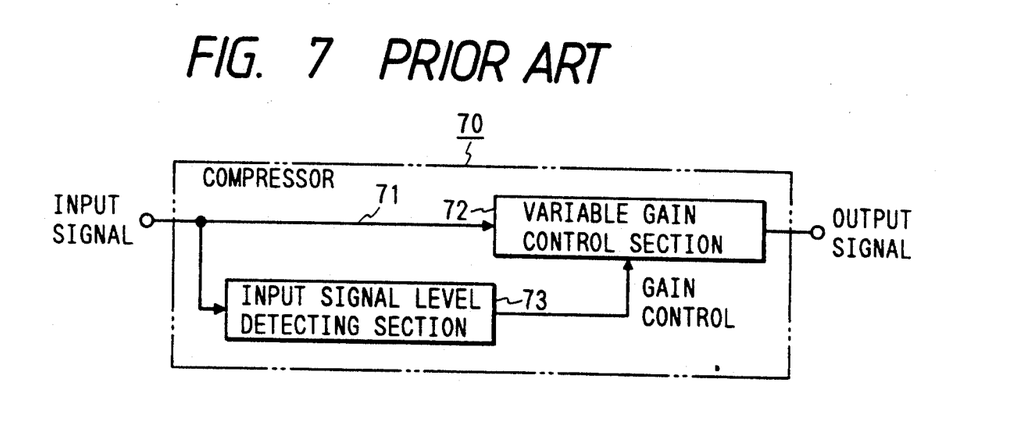
FIG. 7 is a block diagram showing the arrangement of a conventional compressor in an audio device.

FIG. 7 illustrates an example of a compressor found in a conventional audio device. In the compressor 70, amplification gain of a variable gain control section 72 connected to a signal line 71 is varied according to the level of an input signal which is detected with an input signal level detecting section 73. Signal compression is typically performed according to an input-output characteristic, such as the one shown by the solid line 81 in FIG. 8. In other words, the gain of variable gain control section 72 is increased or decreased according to the level of the input signal, such that the dynamic range of the output signal is compressed. As a result of compressor operation, musical audio signals having low volume are increased to be heard over interfering background noises, and musical audio signals having high volume are decreased so as not to be offensive to the ear. Thus, the difficulty accompanying musical audio signals having portions with widely variable volumes is somewhat eliminated.

Figure 8:
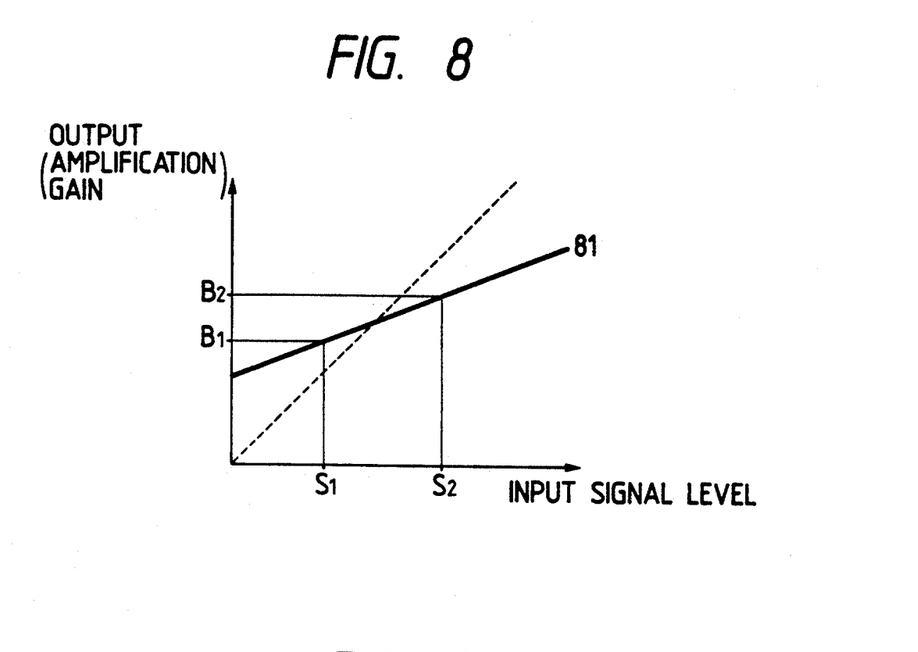
FIG. 8 is a graphical representation indicating an input-output characteristic of a compressor.
Figure 9:
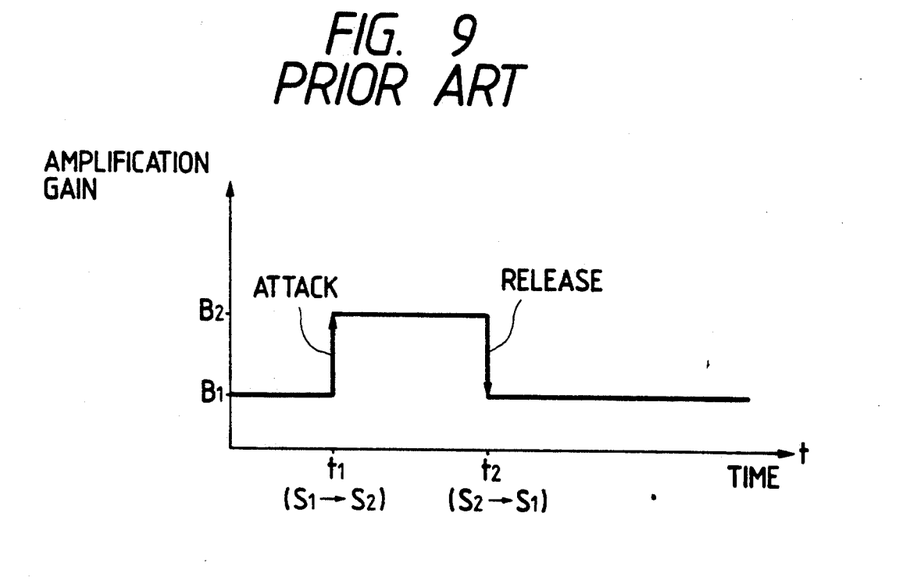
FIG. 9 is a graphical representation indicating a response characteristic for switching an amplification gain in the conventional compressor.

In the conventional compressor circuit having the input-output characteristic shown in FIG. 8, when the input signal level changes from $S_1$ to $S_2$, and back to $S_1$, the amplification gain is changed from $B_1$ to $B_2$, and back to $B_1$. The switching amplification gain is effected by a time constant which is determined by the circuitry arrangement and circuit elements used in the conventional compressor. The general relationship between switching amplification gain and attack and release time is shown in FIG. 9.

Attack (or rise) time for increasing amplification gain to a first predetermined value should be controlled as follows: In a case where input signal level is high, and in order to eliminate the problem of output signal saturation or clipping, it is necessary to reduce the attack time to suppress the input signal level as quickly as possible. In a case where input signal level is low, and in order to eliminate the problem of mushy sounding reproduced audio signals, it is necessary to increase the attack time to improve audio crispness resulting from the attack at the rise of the signal.

In addition, release (or fall) time for decreasing amplification gain to a second predetermined value should be controlled as follows: In general and in order to respond to a high signal level as quickly as possible, when the input signal level is high, the release time should be somewhat short, whereas when the input signal level is low, the release time should be relatively longer so that the audio signals are reproduced to sound natural.

Conventional compressor designs have not fully taken into account the above-described requirements. In contrast, amplification gain in conventional compressors is switched with attack and release time constants typically determined by the circuitry arrangement and circuit elements used in the compressor. The above-described problems are apparent not only in conventional compressor designs, but also in other conventional signal processing circuits such as a limiters and expanders.

SUMMARY OF THE INVENTION

The present invention has been made in view of the above circumstances. Accordingly, an object of the invention is to provide a signal processing circuit which changes amplification gain of the variable gain control section according to attack and release time constants determined by the audio signal level. Signal processing operation thus provides audio signals which have less distortion than conventionally reproduced audio signals and which sound more natural.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the signal processing circuit of the present invention comprises; a variable gain control section for providing a variable amplification gain to an input signal in response to a gain control signal, an input signal level detecting section for detecting a level of the input signal and for generating a corresponding detection signal, a time constant setting section for storing a plurality of time constant tables, each one of the plurality of time constant tables including a set of input signal delay characteristics corresponding to a predetermined level of the input signal, and a time constant selecting section for selecting one of the plurality of time constant tables in the time constant setting section in response to the detection signal, such that the gain control signal is determined by the selected one of the plurality of time constant tables and the amplification gain of the variable gain control section is varied according to the selected one of the plurality of time constant tables.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings.

DETAILED DESCRIPTION OF THE INVENTION

Embodiments of the present invention will now be described with reference to the accompanying drawings.

Figure 1:
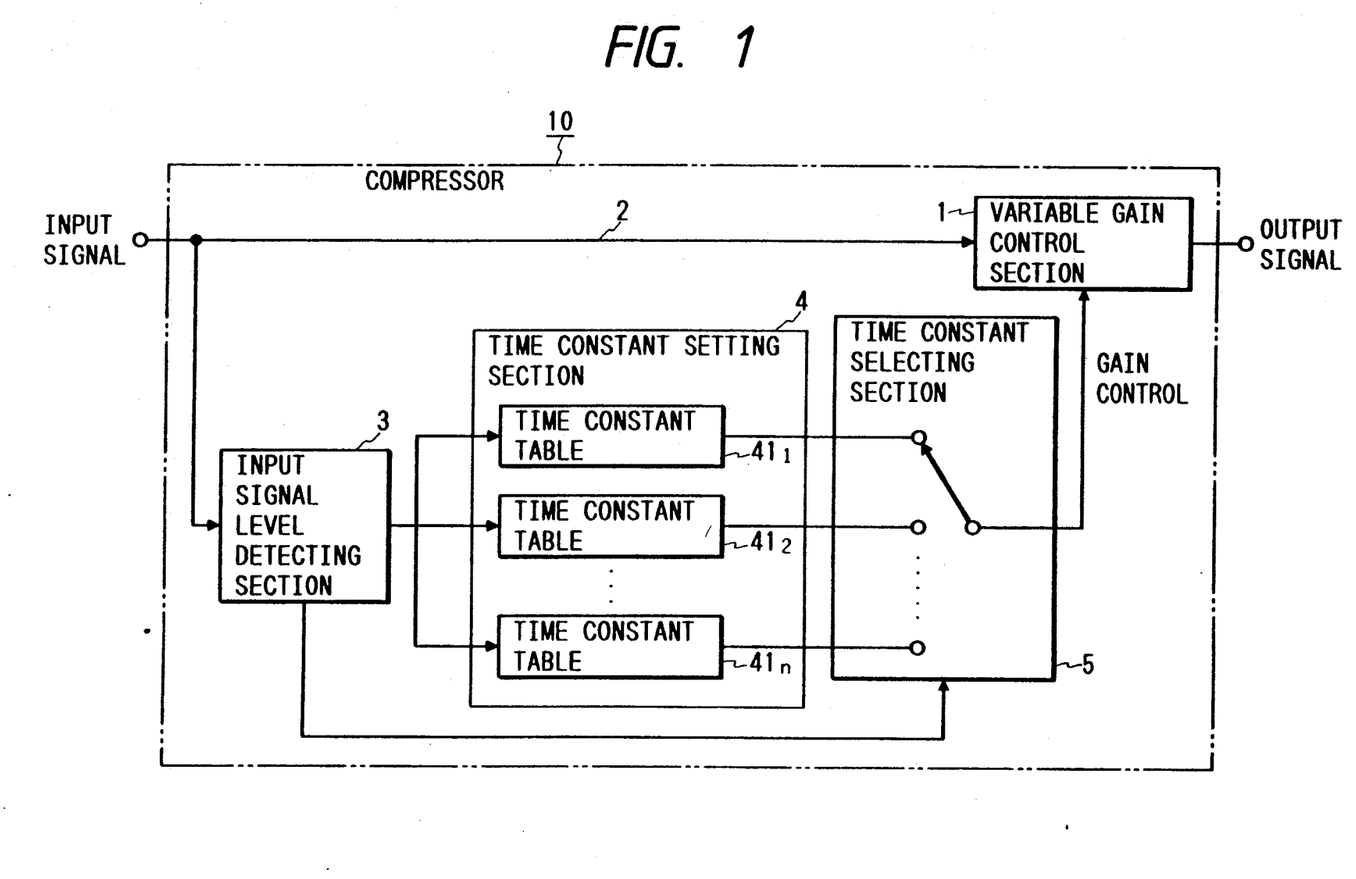
FIG. 1 is a block diagram showing the arrangement of an example of a compressor in an audio device, which constitutes a first embodiment of this invention.

A first embodiment of the present invention identified with a signal processing circuit in an audio device, namely, compressor 10, is shown in FIG. 1. The circuit includes a variable gain control section 1 connected to a signal line 2, an input signal level detecting section 3, a time constant setting section 4, and a time constant selecting section 5.

Variable gain control section 1 is an amplifier capable of freely varying its amplification gain, and having an input-output characteristic such as the one shown in FIG. 8. Input signal level detecting section 3 operates to detect the level of an input signal and to provide a detection signal applied as a gain control signal to variable gain control section 1.

The time constant setting section 4 is a circuit storing a plurality of time constant tables $41_1$ through $41_n$. Each time constant table has its own attack and release time constants (delay characteristics) as shown by the examples in FIGS. 2(a) and 2(b). Time constant tables $41_1$ through $41_n$ respectively correspond to predetermined input signal levels. That is, each time constant table defines an optimal attack time $\tau_a$ and a release time $\tau_r$ for an input signal having a predetermined signal level. The attach and release times provide respective delay characteristics in changing the amplification gain of the input signal.

Time constant selecting section 5 is a circuit which, according to the detection signal output from the input signal level detecting section 3, selects one of the plurality of time constant tables in time constant setting section 4. As discussed hereafter, the time constant selecting section may also operate to select one of the plurality of time constant tables in time constant setting section 4 according to the level of the output signal of the variable gain control section 1, or the level of a sound volume control signal provided from the audio device.

Thus, in the signal processing circuit of the present invention, amplification gain of the variable gain control section is varied with the delay characteristic of the time constant table selected. Therefore, if time constant tables are determined which have optimal delay characteristics relative to one of the foregoing gain control signals then the amplification gain can be changed with the optimal delay characteristic selected on the basis of the gain control signal. As a result, the output signal of the signal processing circuit has less distortion, and sounds more natural.

The operation of the present invention within the exemplary compressor will be described with reference to FIG. 1.

A signal applied to compressor 10 is supplied to variable gain control section 1, and input signal level detecting section 3. Input signal level detecting section 3 detects the level of the input signal, and generates a corresponding detection signal. The detection signal is applied to time constant setting section 4, and time constant selecting section 5. The detection signal applied through time constant setting section 4 serves as a gain control signal for variable gain control section 1, and the detection signal applied to time constant selecting section 5 serves as a time constant table selecting signal.

Time constant selecting section 5 selects, in accordance with the detection signal provided by input signal level detecting section 3, one of the plurality of time constant tables $41_1$ through $41_n$ stored in time constant setting section 4.

Figure 2A:
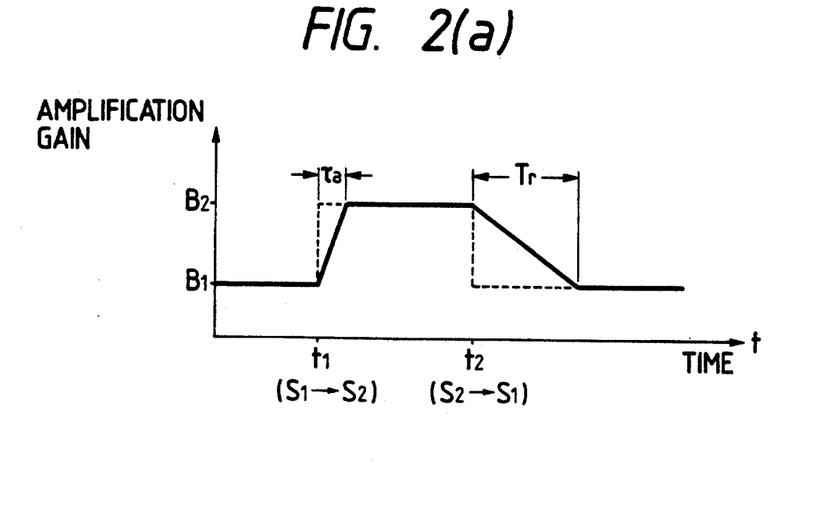
FIGS. 2(a) and 2(b) are graphical representations showing examples of a time constant table in the first embodiment.
Figure 2B:
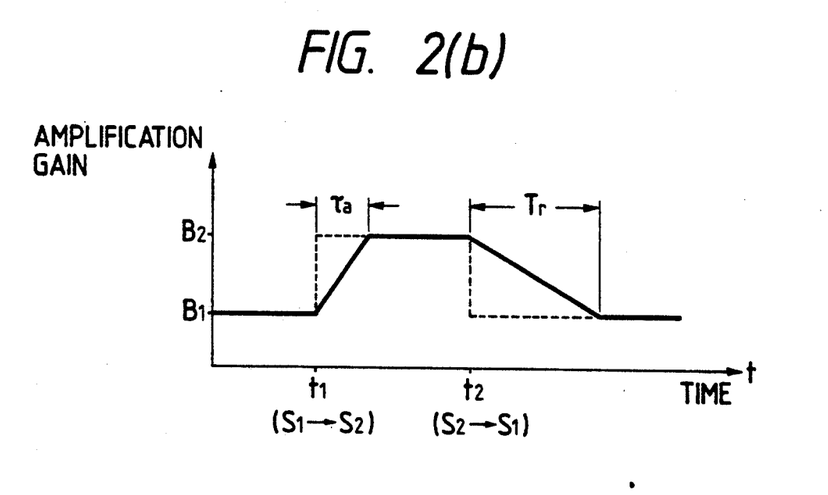

The detection signal from input signal level detecting section 3 is applied through time constant setting section 4 to the variable gain control section 1, is delayed according to an intrinsic delay characteristic of the selected time constant table. Therefore, amplification gain of variable gain control section 1 is changed according to the delay characteristic of the selected time constant table, as shown in FIGS. 2(a) and 2(b).

As a result, amplification gain of variable gain control section 1 is changed in accordance with an optimal time constant selected in view of the input signal level. Operation of an audio device incorporating a compressor made in accordance with the present invention is made more linear, that is, signal distortion in the output audio signals is decreased. In addition, an audio device incorporating a compressor made in accordance with the present invention is substantially free from the problems associated with inappropriate attack time $\tau_a$ and release time $\neq_r$. Thus, reproduced audio signals sound more natural under varying degrees of amplification.

Figure 3:
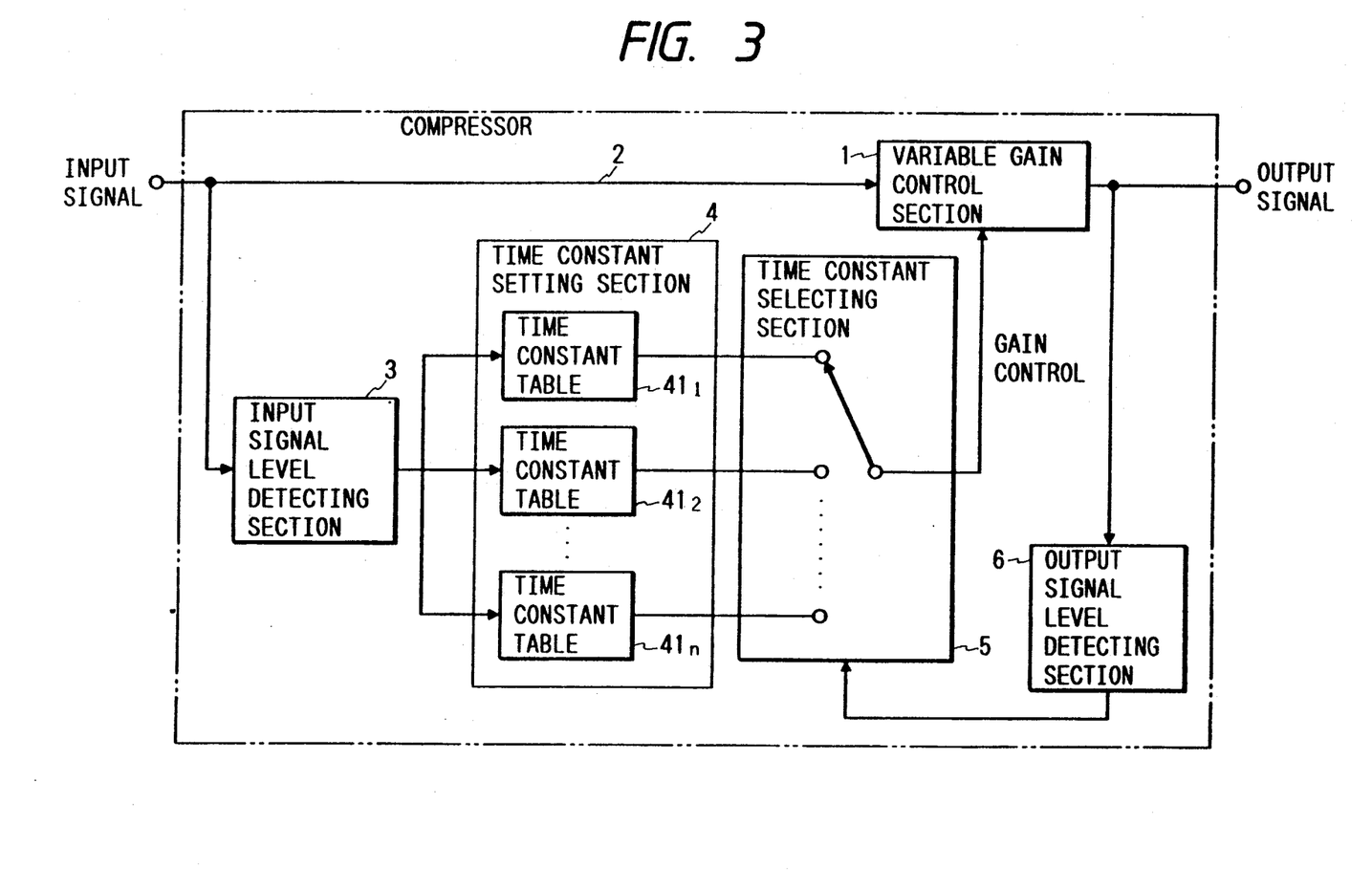
FIG. 3 is a block diagram showing the arrangement of another example of the compressor, which constitutes a second embodiment of the invention.

Another example and second embodiment of the present invention is set forth in the exemplary compressor circuit shown in FIG. 3. Similarly identified elements have functions corresponding to those already described with reference to FIG. 1. The second embodiment of the present invention is designed as follows: One of the plurality of time constant tables $41_1$ through $41_n$ is selected according to the level of the output signal of variable gain control section 1. For this purpose, an output signal level detecting section 6 is connected to the output terminal of variable gain control section 1, and a detection signal provided by output signal level detecting section 6 is applied to time constant selecting section 5.

Figure 4:
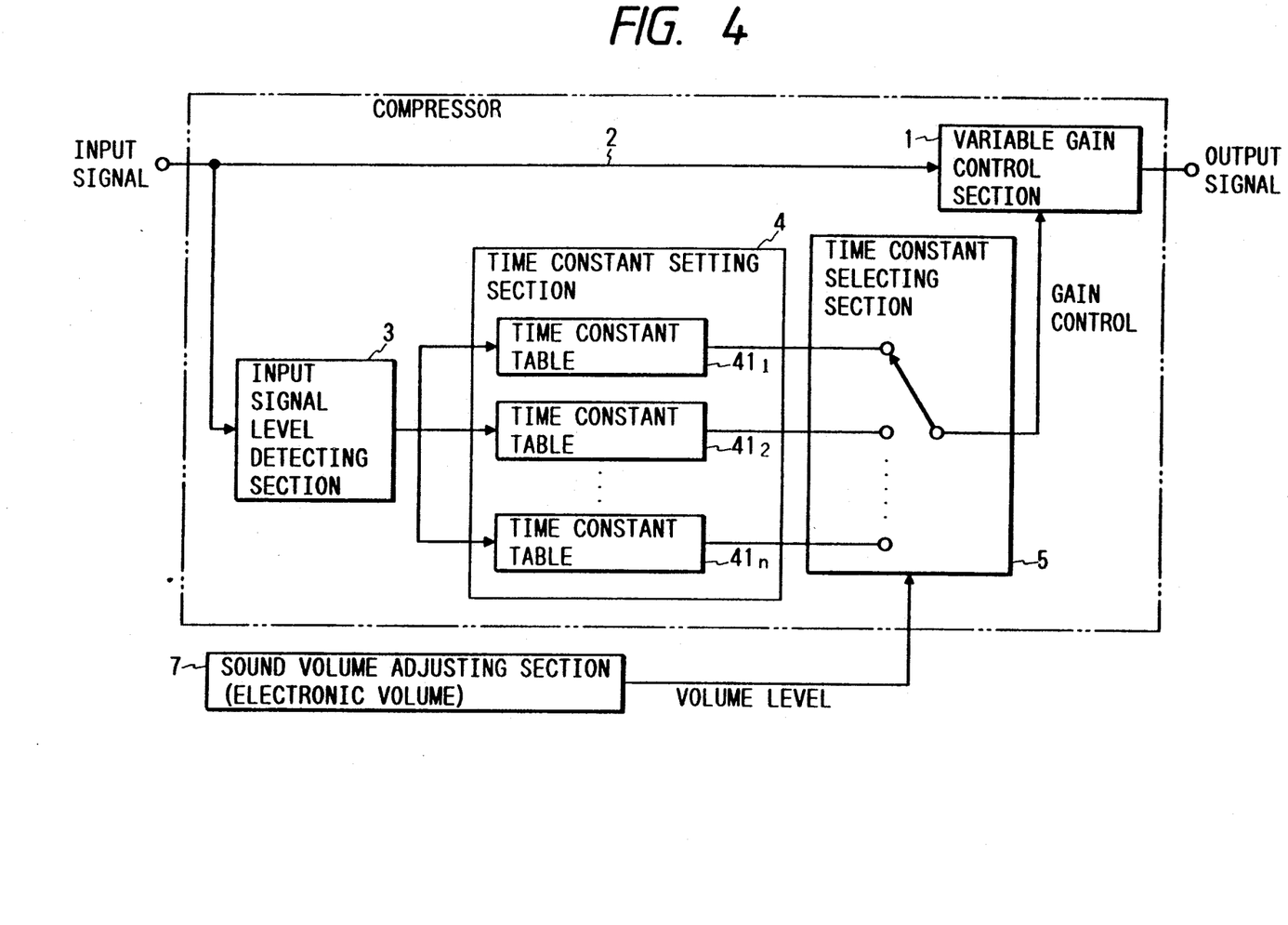
FIG. 4 is a block diagram showing the arrangement of still another example of the compressor, which constitutes a third embodiment of the invention.

Still another example and third embodiment of the present invention is set forth in the exemplary compressor circuit, shown in FIG. 4. Similarly identified elements have functions corresponding to those already described with reference to FIGS. 1 and 2. In the third embodiment of the present invention, a volume level signal provided by a sound volume control section (or electronic volume control section) 7 in the audio device is applied as a select signal to time constant selecting section 5.

Figure 5:
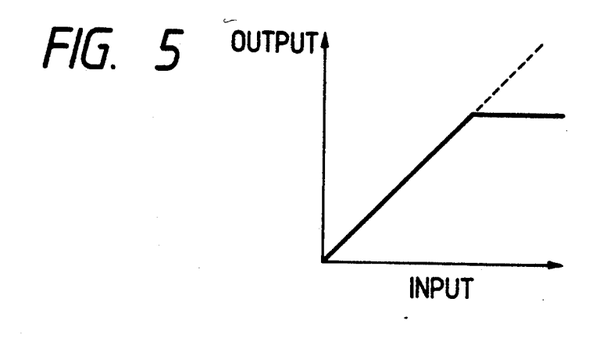
FIG. 5 is a graphical representation showing an input-output characteristic of a limiter in an audio device.
Figure 6:
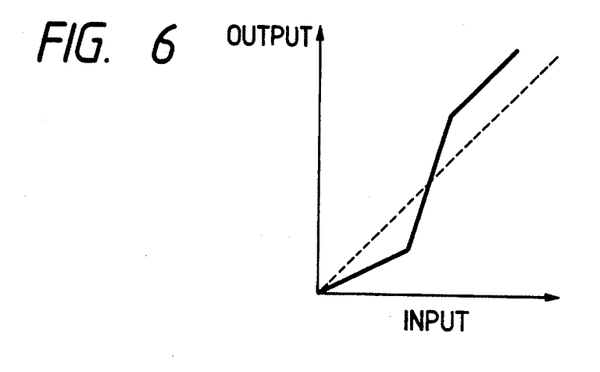
FIG. 6 is also a graphical representation showing an input-output characteristic of an expander in an audio device.

In the above-described embodiments, the present invention is applied to exemplary compressor circuits for an audio device. However, if variable gain control section 1 is assumed to have an input-output characteristic such as one shown, for example, in FIGS. 5 or 6, then the exemplary circuit may be employed as a limiter or an expander.

Furthermore, in the above-described embodiments, a hardware circuit is described. However, the circuit may be replaced, partially or in full, by software routines which perform similar functions. For example, a digital signal processor (DSP) may be used instead of the circuits previously shown. In the case of a DSP, the input-output characteristic of variable gain control section 1, and the plurality of time constant tables in time constant setting section 4 can be readily changed by means of software, which makes it possible to provide a system having considerably higher degrees of freedom.

As is apparent from the above description, in the signal processing circuit of the present invention provides a plurality of time constant tables for determining the attack time and release time to change the amplification gain of the variable gain control section. The time constants are thus suitably switched according to the level of the input signal. Therefore, the signal processing circuit of the present invention provides an output signal having less distortion and a more natural sound.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A signal processing circuit in an audio device comprising:

variable gain control means for providing a variable amplification gain to an input signal in response to a gain control signal;

input signal level detecting means for detecting a level of the input signal and for generating a corresponding detection signal;

time constant setting means for storing a plurality of time constant tables, each one of the plurality of time constant tables including a set of input signal delay characteristics corresponding to a predetermined level of the input signal; and time constant selecting means for selecting one of the plurality of time constant tables in the time constant setting section in response to the detection signal;

wherein the gain control signal is determined by the selected one of the plurality of time constant tables, such that the amplification gain of the variable gain control section is varied according to the selected on of the plurality of time constant tables.

2. The signal processing circuit of claim 1, wherein the input signal delay characteristics include an amplification gain attack time and an amplification gain release time.

3. A signal processing circuit in an audio device comprising:

variable gain control means for providing a variable amplification gain to an input signal in response to a gain control signal to produce an output signal;

time constant setting means for storing a plurality of time constant tables, each one of the plurality of time constant tables including a set of input signal delay characteristics corresponding to a predetermined level of the output signal;

output signal level detecting means for detecting a level of the output signal, and for generating a corresponding detection signal; and time constant selecting means for selecting one of the plurality of time constant tables in the time constant setting section in response to the detection signal;

wherein the gain control signal is determined by the selected one of the plurality of time constant tables, such that the amplification gain of the variable gain control section is varied according to the selected one of the plurality of time constant tables.

4. The signal processing circuit of claim 3, wherein the input signal delay characteristics include an amplification gain attack time and an amplification gain release time.

5. A signal processing circuit in an audio device having sound volume adjusting means for generating a sound volume control signal, comprising:

variable gain control means for providing a variable amplification gain to an input signal in response to a gain control signal;

time constant setting means for storing a plurality of time constant tables, each one of the plurality of time constant tables including a set of input signal delay characteristics corresponding to a predetermined level of the sound volume control signal; and time constant selecting means for selecting one of the plurality of time constant tables in the time constant setting section in response to sound volume control signal, and for generating the gain control signal in accordance with the selected one of the plurality of time constant tables, such that the amplification gain of the variable gain control section is varied in accordance with the selected one of the plurality of time constant tables.

6. The signal processing circuit of claim 5, wherein the input signal delay characteristics include an amplification gain attack time and an amplification gain release time.

* * * * *

UNITED STATES PATENT AND TRADEMARK OFFICE
CERTIFICATE OF CORRECTION

PATENT NO. : 5,255,325
DATED : October 19, 1993
INVENTOR(S) : Shunsuke Ishimitsu et al.

It is certified that error appears in the above-indentified patent and that said Letters Patent is hereby corrected as shown below:

Claim 1, column 6, line 20, change "on" to --one--.

Signed and Sealed this

Sixteenth Day of August, 1994

Attest:

BRUCE LEHMAN

Attesting Officer     *Commissioner of Patents and Trademarks*